(12) United States Patent
Lattimore et al.

(10) Patent No.: US 6,353,558 B1
(45) Date of Patent: Mar. 5, 2002

(54) METHOD AND APPARATUS FOR WRITING TO MEMORY CELLS

(75) Inventors: George M. Lattimore; Jose Angel Paredes, both of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/750,254

(22) Filed: Dec. 28, 2000

(51) Int. Cl.[7] .............................. G11C 7/00; G11C 15/00
(52) U.S. Cl. ............... 365/189.07; 365/49; 365/189.04; 365/230.06
(58) Field of Search .............................. 365/189.07, 49, 365/230.06, 233, 189.04

(56) References Cited

U.S. PATENT DOCUMENTS

| | | | | |
|---|---|---|---|---|
| 4,935,896 A | * | 6/1990 | Matsumura et al. | ........ 365/187 |
| 5,226,005 A | * | 7/1993 | Lee et al. | ...................... 365/49 |
| 5,701,267 A | * | 12/1997 | Matsuda et al. | ............ 365/201 |
| 6,212,106 B1 | * | 4/2001 | Kurotsu | ................. 365/189.07 |

* cited by examiner

*Primary Examiner*—Son Mai
(74) *Attorney, Agent, or Firm*—Anthony V. S. England; Casimer K. Salys

(57) ABSTRACT

An apparatus embodiment of the present invention includes a memory array with lines of memory cells. The lines are coupled to respective wordlines. The lines may be selected by a wordline signal that is asserted responsive to a first clock signal being asserted. The apparatus also includes "write wordline" generators coupled to respective ones of the wordlines. A write wordline generator will assert a write wordline signal responsive to a second clock signal being asserted and before the next time the first clock signal is asserted, but after the first clock signal is deasserted. The apparatus further includes a comparator, which has a first set of inputs coupled to bit lines of the memory cells for reading the contents of the cells, and a second set of inputs for reading a data value. The comparator has a compare match output upon which it asserts a compare match signal if the contents matches the data value. In response to the compare match and write wordline signals, a write operation occurs for the line. Due to the timing of the write wordline signal, the write operation advantageously occurs in the same clock cycle during which the line was selected without any additional decoding.

19 Claims, 6 Drawing Sheets

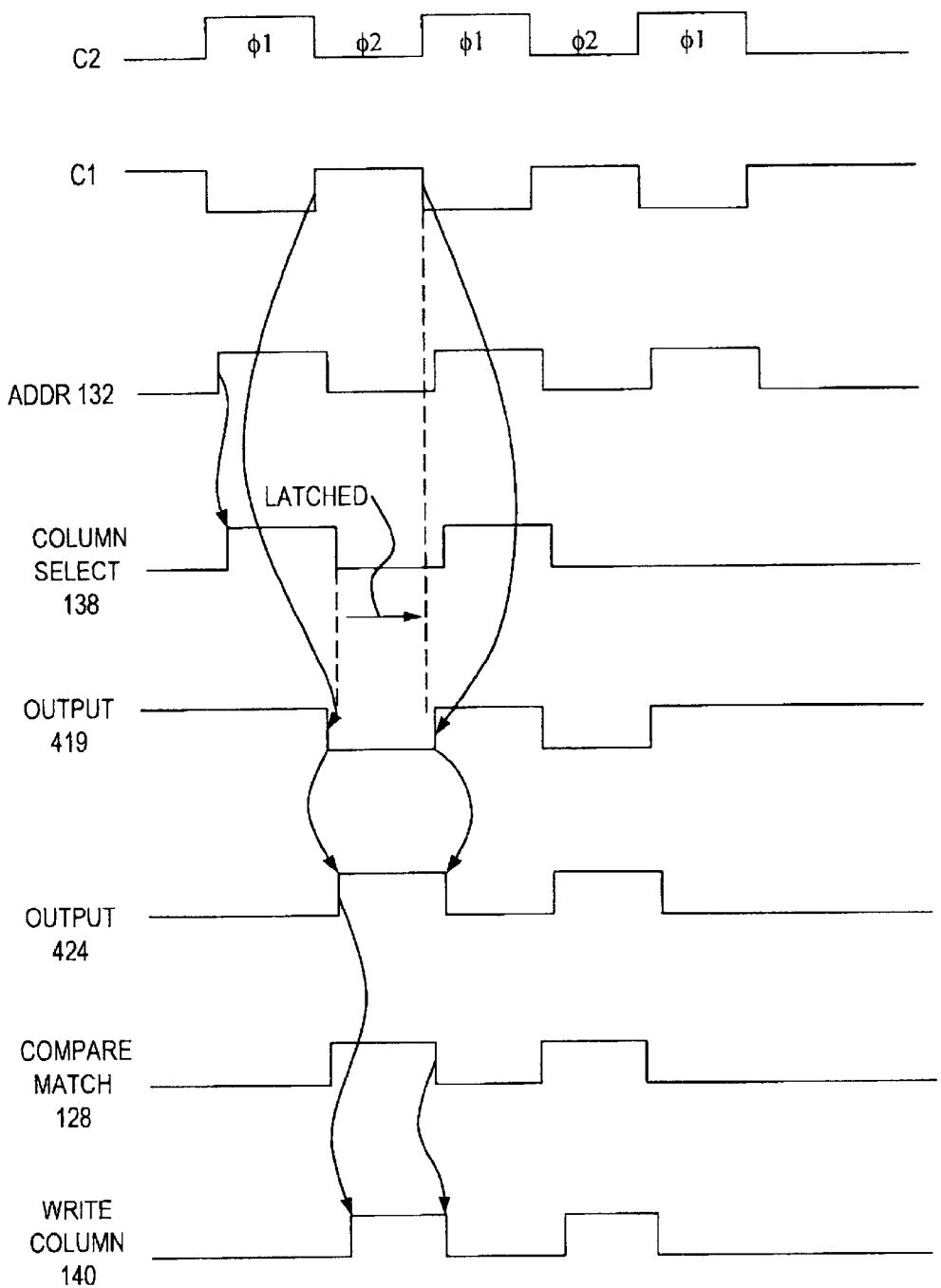

METHOD AND APPARATUS FOR WRITING TO MEMORY CELLS

CROSS-REFERENCE TO RELATED APPLICATION

This application is related to the following application, which is hereby incorporated herein by reference and is co-pending and assigned to the same assignee: "Real Address Tag Array," Ser. No. 09/435,862, filing date Nov. 8, 1999.

BACKGROUND OF THE INVENTION

1. Field of the Invention

The present invention concerns high speed memory arrays. More specifically, the invention concerns reading contents and writing to a portion of a memory array during the same clock cycle without performing another decode operation, depending on the contents of the portion.

2. Related Art

Speed of access to memory is a critical performance factor for high speed microprocessors. Reading a cache memory is faster than writing, because when writing to a cache memory location, the location must first be found by reading an address tag before writing to the location. Therefore it is particularly important to improve speed of access to cache memory for write operations. One way this is conventionally done is by "pipelining" writes, according to which during a first cycle a tag is read in a first pipeline stage for a first data location, and during a second cycle a second tag is read in the first stage for a second data location while the write operation to the first data location is performed in the second pipeline stage. Subsequently, a write operation may occur each cycle, since for each cycle a tag is read in the first stage and data is written in the second stage.

One limitation to this technique for improving write cycle time arises with sequential writes to a same data location. This does not tend to happen often in many applications, but it still presents an issue. Furthermore, at least in the context of "tag arrays" it tends to be more frequent, and thus more problematic.

Tag arrays are memories employed for address translation because a factor which slows cache access time concerns the translation which must occur between virtual addresses used by processes executing on the processor and the corresponding physical addresses of the processing system main memory. To improve access time for a cache, virtual addressing may be used for the cache. This in turn gives rise to using a tag array for certain aspects of cache access. Due to the nature of this application, for tag array memories there tends to be more frequent occurrence of sequential writes to a single location.

In one conventional way of handling an operation such as this, where a read must precede a write, the wordline for a selected line is held up for the full time of both the read and the write portions of the operation. This can present cycle time problems, according to which another interval is needed to restore bit lines. In one conventional alternative a multiport cell array is used, according to which one port is used for reading and another is used for writing, however, this has conventionally introduced the complication of a second decoder to enable the write wordline separate from the read wordline.

Thus there is a need to improve speed of memory write operations, including clear operations. Furthermore, the need is particularly acute in the context of memory arrays used for address tag arrays.

SUMMARY

The present invention addresses the foregoing need as follows. In a first form, a method embodiment for selectively writing to a line in a memory array, includes the step of selecting a line in the memory array responsive to a first clock signal (clock "C2") being asserted. Then the contents of the selected line is compared to a value. The line is written to selectively. That is, if the contents matches the value, the line is written responsive to a second clock signal (clock "C1") being asserted. This writing occurs after the first clock signal is deasserted, and before the next time the first clock signal is asserted.

In another aspect, the step of selecting the line includes asserting an address signal to an address decoder during an interval when the first clock signal is asserted, and asserting a wordline signal for the line in the memory array responsive to decoding the address.

In a further aspect, the step of selectively writing to the line includes writing responsive to a "write wordline" signal being asserted for the line. In an embodiment, asserting the write wordline signal includes, first deasserting the wordline signal responsive to the first clock signal being deasserted. The asserting of the write wordline signal is triggered responsive to the wordline transitioning from being asserted to being not asserted. Further, the write wordline signal is held asserted until the second clock signal is deasserted.

In another aspect, it should be noted that the write wordline is asserted without any extra decoding, that is, without any decoding in addition to the wordline and column decoding.

In another aspect, the step of selectively writing includes asserting a compare match signal responsive to the contents matching the value while C1 is asserted, and writing responsive to the compare match and write wordline signals.

In one embodiment the memory array is folded. That is, the array has at least first and second columns of bit lines. In this embodiment the method includes asserting a column select signal responsive to decoding the address, and, in another aspect, includes asserting a "write column" signal for the line. The writing is thus responsive to the write column signal.

In an aspect, asserting the write column signal includes first deasserting the column select signal responsive to the first clock signal being deasserted. Then the asserting of the write column signal is triggered responsive to the compare match signal and to column select signal being asserted Further, the write column signal is held asserted until the second clock signal is deasserted.

In another form, an apparatus embodiment includes a memory array with lines of memory cells. The lines are coupled to respective wordlines. The lines may be selected by a wordline signal that is asserted responsive to the first clock signal, as described above. The apparatus also includes "write wordline" generators coupled to respective wordlines. The apparatus further includes a comparator, which has a first set of inputs coupled to bit lines of the memory cells for reading the contents of the cells, and a second set of inputs for reading a value. The comparator has a compare match output upon which it asserts a compare match signal if the contents matches the value. In response to the compare match and write wordline signals, a write operation occurs for the line.

In a further aspect, the apparatus includes an address decoder coupled to the wordlines and to address lines. The address decoder is operable to assert a signal on one of the wordlines responsive to an address being asserted on the address lines.

In another aspect, according to one embodiment the write wordline generator includes first combinational logic circuitry, which has first and second input nodes coupled respectively to the second clock signal and one of the wordlines. This logic circuitry has an output node on which it asserts a voltage responsive to the clock signal and the wordline signal.

In yet another aspect, the write wordline generator includes latch circuitry, which has an input node coupled to the first combinational logic circuitry output node. The latch circuitry has an output node on which it asserts an output voltage. This output is asserted responsive to the first combinational logic circuitry output being asserted. Further, the latch holds the asserted latch output until the second clock signal is deasserted.

In yet another aspect, the write wordline generator includes final stage circuitry, which has first and second input nodes coupled respectively to the wordline and the latch circuitry output node. The final stage circuitry also has an output node on which it asserts a voltage responsive to the wordline signal and the first latch circuitry output being asserted.

In one embodiment the memory array array is folded, and therefore has at least first and second columns of bit lines. According to this embodiment, the address decoder has a column select output on which it asserts a column select signal responsive to the address asserted on the address lines.

In a further aspect of the folded array embodiment, the apparatus includes "write column" generators for the respective columns. The write column generators are coupled to the compare match output and the column select output. A write column generator will assert a write column signal responsive to the compare match signal and the column select signal in order to write to the line selected by one of the wordline signals and the column selected by the column select signal.

According to another aspect, such a write column generator includes second combinational logic circuitry, which has first and second input nodes coupled respectively to the second clock signal and the column select output. This second combinational logic circuitry has an output node on which it will assert a voltage responsive to the clock signal and the column select signal.

Further, such a write column generator includes, in another aspect, second latch circuitry, which has an input node coupled to the second combinational logic circuitry output node. The second latch circuitry has an output node on which it will assert an output voltage. The asserting of the output is triggered responsive to the second combinational circuitry output being asserted. Once asserted, the second latch holds its output until the second clock signal is deasserted.

In a further aspect, the write wordline generator includes second final stage circuitry, which has first and second input nodes coupled to the compare match output and to the second latch circuitry output node. The second final stage circuitry has an output node on which it will assert a voltage responsive to the compare match signal and the second latch circuitry output being asserted.

In one embodiment, the writing is merely to clear a valid bit for the selected line. However, in other embodiments, the writing is not necessarily limited to just clearing a single bit. Also, in this embodiment by doing a clear, the write column can only reset the value of the cell. In other embodiments, the cell could be written with a dual rail write column enabling a true write to occur, i.e. either a one or a zero could be written to the memory cell.

From the foregoing, it should be appreciated it is advantageous that when a line is selected by the wordline at the beginning of a cycle of the first clock responsive to the first clock signal being asserted, if a tag match is detected for the line and the clear, or more generally the write operation, is therefore selected to occur for the line, the write will occur during the same cycle of the first clock. Moreover, this is achieved with a single decoder for multiport memory cells. That is, the memory cells include one port which has a bit line pair for reading (or writing), in the present context, and a special port with a single bit line for clearing, so that in the same clock cycle that the standard bit line pair reads the cell, the cell may be cleared with the special, single bit line while the standard bit line pair is being restored.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 6 illustrates timing of certain signals of FIGS. 1, 2 and 4, according to an embodiment of the present invention.

DETAILED DESCRIPTION OF THE PREFERRED EMBODIMENT

In the following detailed description of the preferred embodiments, reference is made to the accompanying drawings illustrating embodiments in which the invention may be practiced. It should be understood that other embodiments may be utilized and changes may be made without departing from the scope of the present invention.

Figure 1:
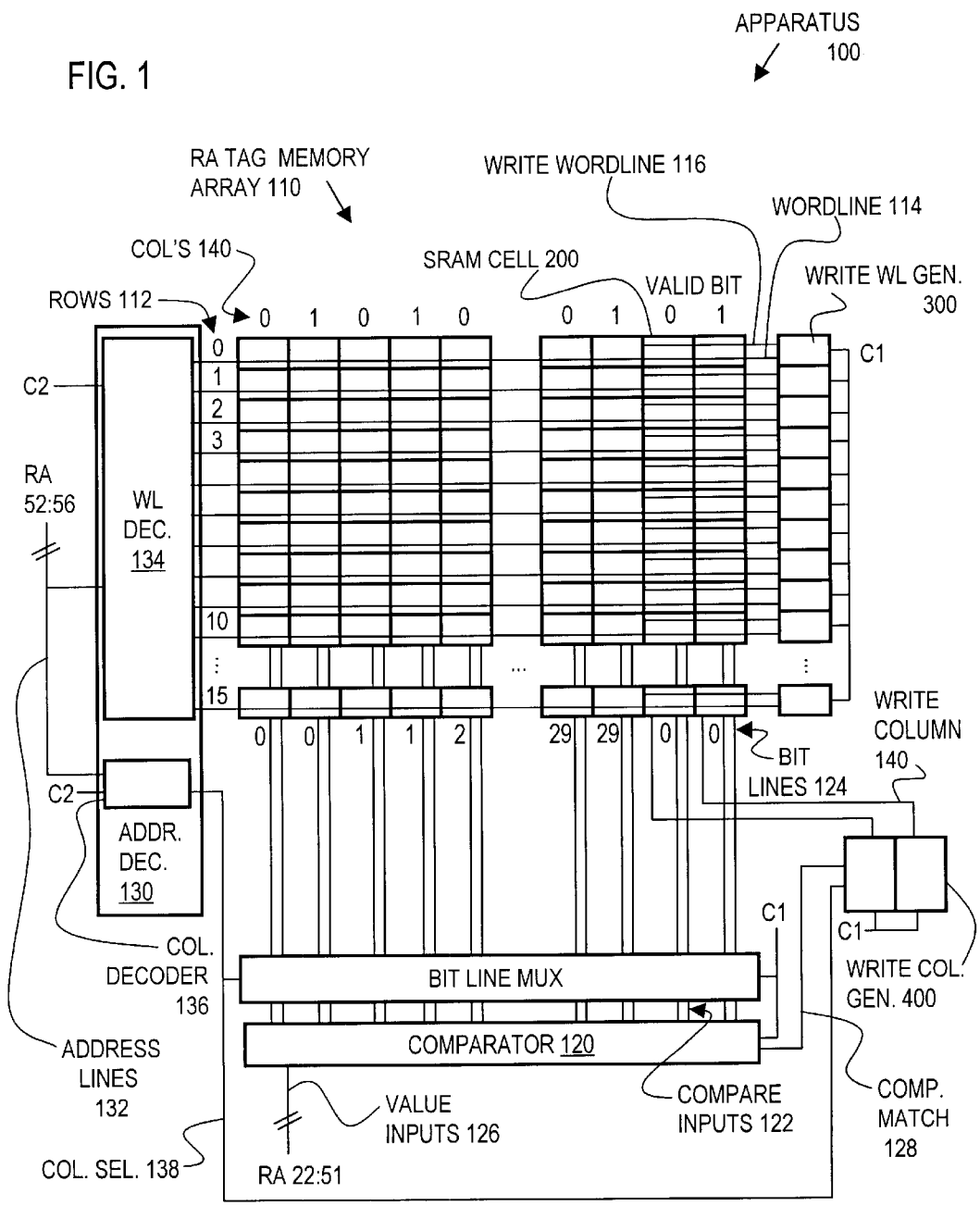
FIG. 1 shows a real address ("RA") tag array, according to an embodiment of the present invention.

Referring now to FIG. 1, an apparatus 100 is shown, which includes a real address tag memory array 110, which has 16 rows 112 (a.k.a. "lines") of static random access memory cells 200. In the embodiment of FIG. 1, the memory array 110 is folded, and therefore has first and second columns of bit lines 124. That is, in FIG. 1 the array 110 has 16 SRAM cells 200 down, i.e. 16 rows 112. Across the top of the array 110 the cells are labeled "0" and "1" alternatively, indicating whether each respective column of cells is a "column 0" cell or a "column 1" cell. For "column 0" there are 30 SRAM cells 200 across for data (numbered 0 through 29 across the bottom of the array 110), and 1 SRAM cell 200 for a valid bit. Likewise for "column 1."

The rows 112 are coupled to respective wordlines 114. The rows 112 may be selected by a wordline signal that is asserted on one of the wordlines 114 while clock signal C2 is asserted, as will be described in connection with FIG. 5 hereinbelow. The apparatus 100 also includes "write wordline" generators 300 coupled to respective wordlines 114. A write wordline generator 300 will assert a write wordline signal on a write wordline 116 responsive to the clock signal C1 being asserted, after the clock signal C2 is deasserted following row 112 having been selected. The apparatus 100 further includes a comparator 120, which has a first set of inputs 122 coupled to pairs of bit lines 124 of the memory cells 200 for reading the contents of the cells, and a second set of inputs 126 for reading a value, shown in the embodiment of FIG. 1 as bits 22 through 51 of a real address ("RA 22:51"). The comparator 120 has a compare match output 128 upon which it asserts a compare match signal if the contents of the cells 200 matches the RA 22:51 value and the line is valid. In response to the compare match and write wordline signals, a write operation occurs for the selected row 112.

The apparatus 100 also includes an address decoder 130 coupled to the wordlines 114 and to address lines 132, which are shown in the embodiment receiving bits 52 through 56 of the real address ("RA 52:56"). The address decoder 130 of FIG. 1 includes a wordline decode portion 134, and a column decode portion 136. The wordline decode portion 134 of decoder 130 is operable to assert a wordline signal on one of the wordlines 114 responsive to the value of an address RA 52:56 being asserted on the address lines 132.

The column decode portion 136 of decoder 130 is operable to assert a column select signal which selects whether column 0 or column 1 is accessed. The column select signal is asserted by column decode portion 136 responsive to the address RA 52:56 on a column select line 138.

The apparatus 100 also includes 2 "write column" generators 400 for the respective columns 0 and 1. The write column generators 400 are coupled to the compare match line 128 and the column select line 138. A write column generator 400 will assert a write column signal on its write column line 140 responsive to the compare match signal and the column select signal in order to write to the bit which is at the intersection of the row 112 selected by one of the wordline signals and the column 0 or 1 selected by the column select signal.

Figure 2:
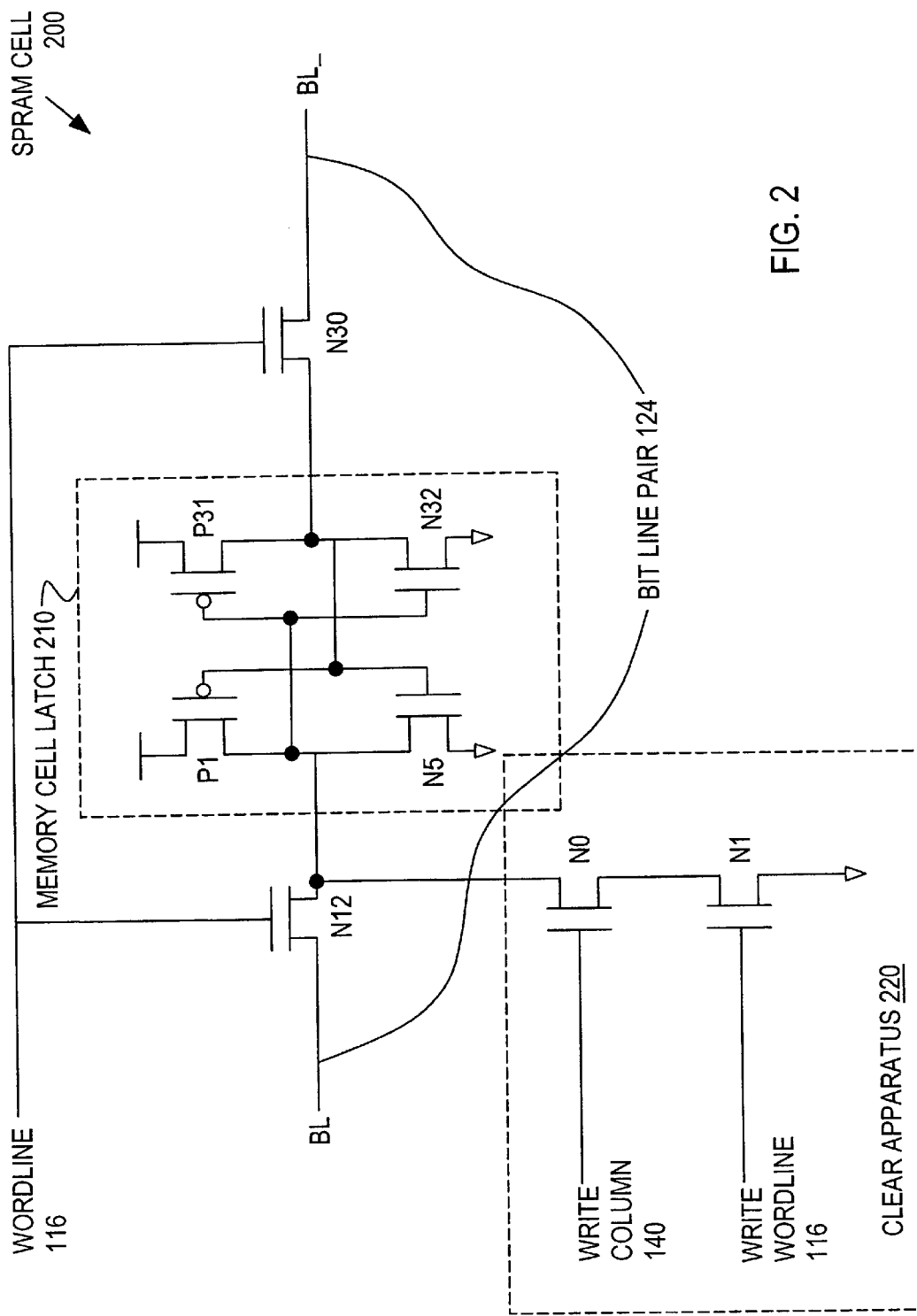
FIG. 2 illustrates one of the static random access memory cell shown in FIG. 1, according to an embodiment of the present invention.

Referring now to FIG. 2, an SRAM cell 200 is illustrated according to an embodiment. The wordline 116 for the cell 200 is coupled to gates of NFET's N12 and N30 for selecting the memory cell latch 210, which includes FET's P1, N5, P31 and N32. One of the conducting electrodes of each of FET's N12 and N30 is coupled to a respective one of the bit lines in the bit line pair 124. Also coupled to the memory cell latch 210 are FET's N0 and N1, which are coupled to ground so that when the FET's N0 and N1 are both turned on the latch 210 is reset, i.e., pulled down to ground. FET N1 has its gate coupled to the write wordline 116 for the cell 200 so that when the write wordline signal is asserted on the wordline 116 the FET N1 will turn on. FET N0 has its gate coupled to the write column line 140 for the cell 200 so that when the write column signal is asserted on the write column line 140 the FET N0 will turn on.

As stated above regarding FIG. 1, in response to the compare match and write wordline signals, a write operation occurs for the selected row 112 of SRAM cells 200 (i.e., the row 112 selected by wordline 114). It should be understood, from the above description of SRAM cell 200 shown in FIG. 2 that in the limited context of the RA tag memory array 110 of FIG. 1, the writing is merely to clear, i.e., reset, the memory latch 210 for the cell 200 containing a valid bit for the selected row 112. However, in other embodiments the writing is not necessarily limited to just clearing a single valid bit. The FETs N0 and N1 are shown as "clear apparatus" 220 to indicate that this line with these FET may or may not be included, depending on the context. In the embodiment of FIG. 1, only the SRAM cells 200 for the valid bits have the clear apparatus 220. It should be understood that another instance of this apparatus 220 could be included on "BL_" so that the apparatus is not limited to just a clear function, but the combination of the two can be used for a true write function, i.e., to write either a 0 of a 1 to the cell latch 210. (Obviously, in this case they would not be tied solely to ground as shown in FIG. 2.)

It should be appreciated from FIGS. 1 and 2 that a single decoder 130 is here being applied for multiport memory cells 200. That is, the memory cells 200 include one port, i.e., bit line pair 124, for reading (and writing), in the present context, and a special, clear port, i.e., clear apparatus 220, with a single bit line, i.e., the line connected between FET N12 and memory cell latch 210 and ground, for writing, so that in the same clock cycle that the standard bit line pair 124 reads the cell 200, the cell may be cleared with the special, single bit line while the standard bit line pair is being restored. The conventional, second decoder for the special port is not required in the present invention due to the functioning of the write wordline generator of FIG. 3, and in the case of folded arrays such as FIG. 1, the functioning of the write column generator of FIG. 4, which latch the result of the decode operation from decoder 130.

Figure 3:
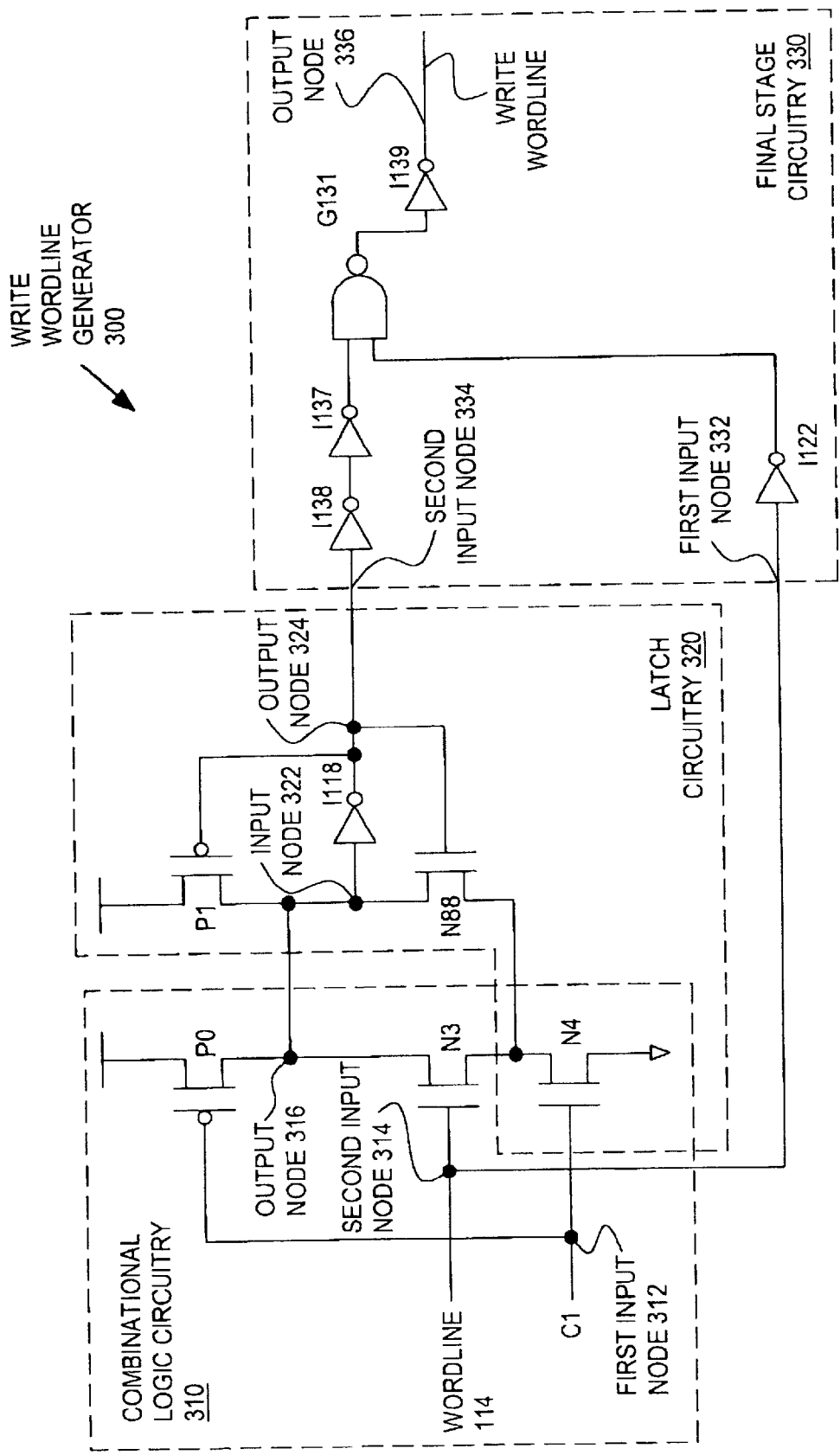
FIG. 3 illustrates one of the write wordline generators shown in FIG. 1, according to an embodiment of the present invention.

Referring now to FIG. 3, an embodiment is shown for the write wordline generator 300. The write wordline generator 300 includes combinational logic circuitry 310, which has a first input node 312 coupled to a clock signal line for clock C1, which will be described further in connection with FIG. 5 hereinbelow. Second input node 314 is coupled to its respective wordline 114. This logic circuitry 310 has an output node 316 for which the voltage is pulled down when the clock signal C1 is asserted and the wordline signal are asserted for the wordline 114.

The write wordline generator 300 also includes latch circuitry 320, which has an input node 322 coupled to the first combinational logic circuitry output node 316. The latch circuitry 320 has an output node 324 on which it asserts an output voltage. This output voltage is asserted high responsive to the first combinational logic circuitry output voltage being asserted low, i.e., deasserted, on node 316. Further, once the output on node 324 is asserted, the latch 320 holds the asserted latch output on node 324 until C1 is deasserted.

The write wordline generator 300 also includes final stage circuitry 330, which has a first input node 332 coupled to the wordline 114, and a second input node 334 coupled to the latch circuitry output node 324. The final stage circuitry 330 also has an output node 336 on which it asserts a voltage responsive to the wordline signal deasserting and the first latch circuitry output being asserted.

Figure 4:
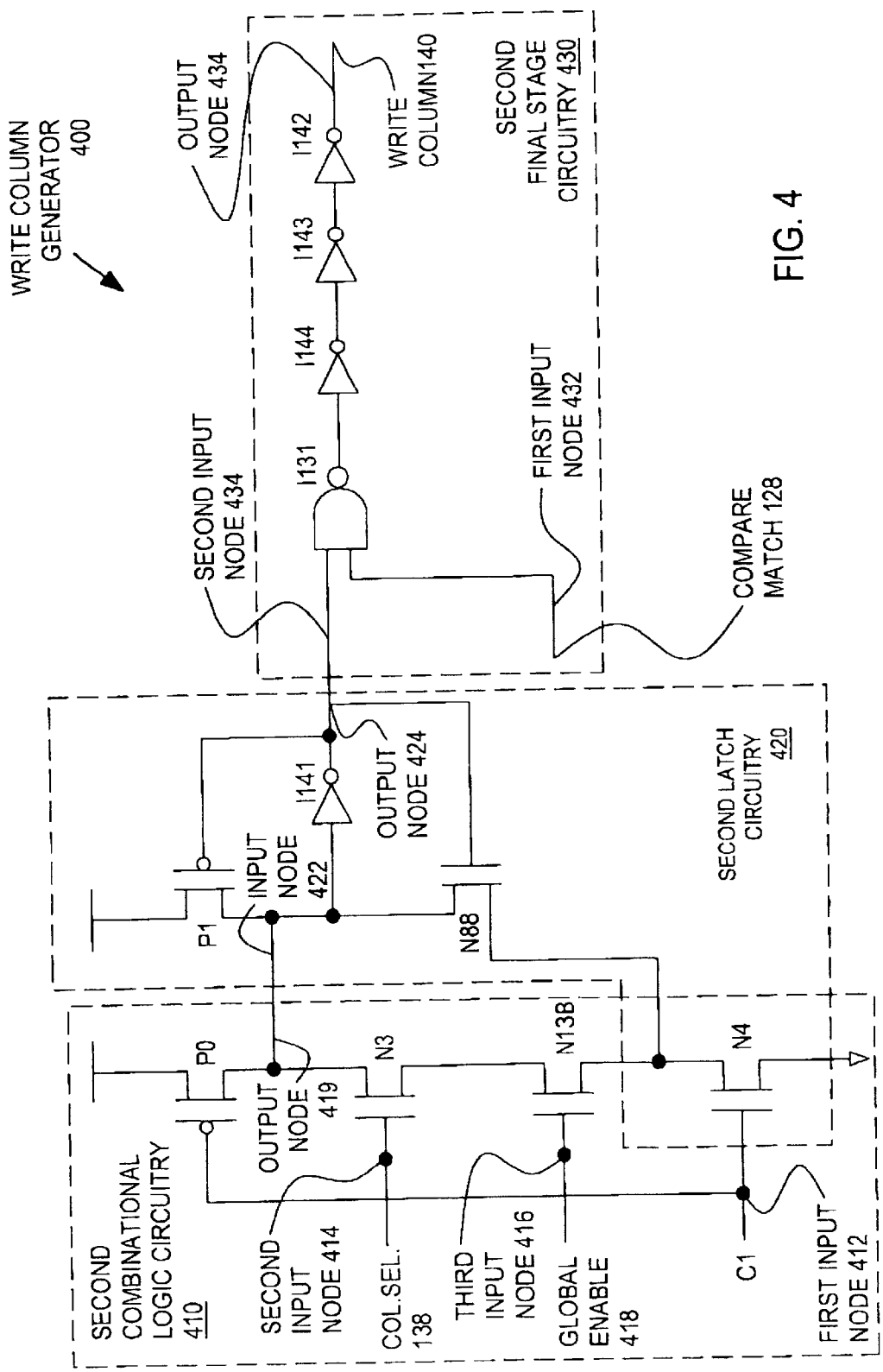
FIG. 4 illustrates one of the write column generators shown in FIG. 1, according to an embodiment of the present invention.

Referring now to FIG. 4, an embodiment is shown for a write column generator 400. This write column generator 400 includes second combinational logic circuitry 410, which has a first input node coupled respectively to clock signal C1, and a second input node 414 coupled to the column select line 138 for receiving the column select signal. The circuitry 410 also has a third input node 416 coupled to a line 418 on which a global enable signal may be asserted. The global enable signal is deasserted to override clearing of a valid bit for certain contexts. For example, the valid bit for a selected line and column should be cleared for a reload or snoop invalidate operation but not for a store hit operation, all of which involve RA tag array 110 accesses.

This second combinational logic circuitry 410 has an output node 419 on which it will assert a low voltage, i.e., deassert its output, responsive to the column select signal and the clock signal C1 being asserted, provided that the global enable signal is asserted.

The write column generator 400 also includes, second latch circuitry 420, which has an input node 422 coupled to the second combinational logic circuitry output node 419. The second latch circuitry 420 has an output node 424 on which it will assert a high output voltage. The asserting of the output is triggered responsive to the second combinational circuitry output being asserted. Once asserted, the second latch 420 holds its output until clock signal C1 is deasserted.

The write column generator 400 also includes second final stage circuitry 430, which has a first input node 432 coupled to the compare match line 128 and a second input node 434 coupled to the second latch circuitry output node 424. The second final stage circuitry 430 has an output node 434 coupled to the write column line 140 on which the circuitry 430 will assert a high voltage responsive to the compare match signal and the second latch circuitry output being asserted.

Figure 5:
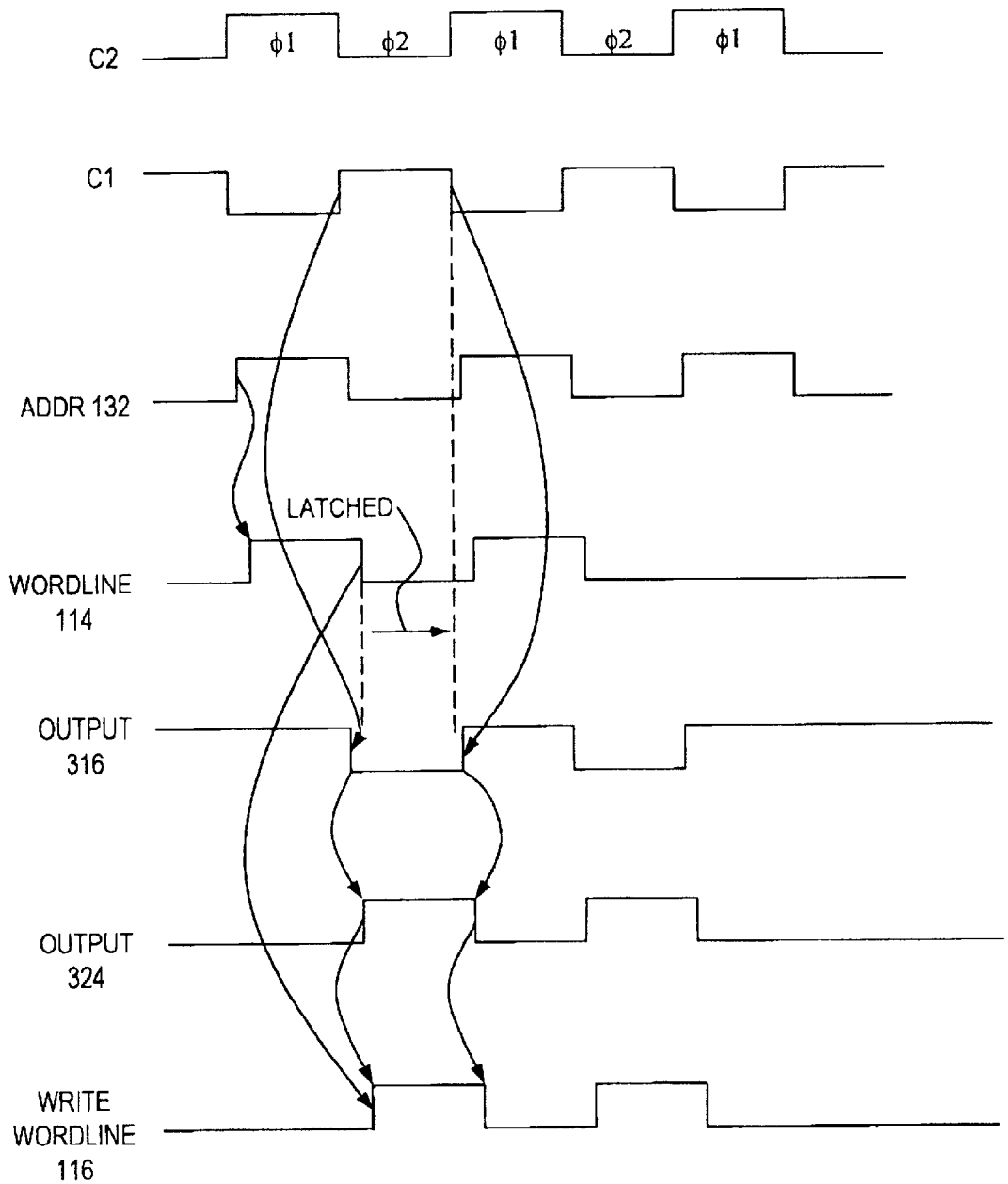
FIG. 5 illustrates timing of certain signals of FIGS. 1, 2 and 3, according to an embodiment of the present invention.

Referring now to FIG. 5, selected signals are shown in the context of their timing and interdependence to illustrate the embodiments of FIGS. 1, 2 and 3. Clock signal C2 is shown, with its alternating first and second phases indicated. Clock signal C1 is used for clocking the write wordline generator 300 and write column generator 400.

Address signal 132 is shown asserted when clock C2 is asserted. This signal 132 is input to address decoder 130 of FIG. 1. Also responsive to clock C2 being asserted a wordline signal is asserted on the wordline 114 for the corresponding write wordline generator 300. The wordline 114 is asserted responsive to decoding the address signal 132.

Responsive to the wordline signal being asserted and clock C1 being asserted, the output voltage on the output 316 of the logic circuitry 310 is pulled down through FET's N3 and N4, which also pulls up the output voltage on node 324 of latch circuitry 320 through inverter I118. This node 324 is held up through FET's P1, N88 and N4 until another occurrence of phase one of the clock C2 (when clock C1 is deasserted).

Next, the wordline signal is deasserted responsive to the clock C2 signal being deasserted. Responsive to the wordline signal on wordline 114 transitioning from being asserted to being not asserted, and the output signal on node 324 being asserted, the write wordline signal on output node 336 is triggered through NAND gate G131. Further, the write wordline signal on node 336 continues to be held up due to the latch circuitry 320., until clock signal C1 is next deasserted.

Referring now to FIG. 6, timing of certain signals of FIGS. 1, 2 and 4 are illustrated. Clock signals C2 and C1 and the address signal on address line 132 are once again depicted. Responsive to the address signal the address decoder 130 selects one of the columns on column select line 138. In the example, a column select signal is shown being asserted for the depicted write column generator responsive to the address decoding. Also responsive to the address signal input to the decoder 130 the comparator 120 of FIG. 1 compares contents of memory cells in whichever row 112 is selected to the RA tag value input 126 of FIG. 1. If there is a match, then the comparator asserts a compare match signal on compare match line 128, as is shown in FIG. 6.

The global enable signal 418 is asserted depending on the context. The RA tag array is addressed for a lookup in at least three circumstances because if two processes have two effective addresses for a line that has the same real address in main memory, the effective address of the line for one process must be aliased to the effective address of the line for the other process. One such circumstance is for a store hit operation. For a store hit, the RA tag is referenced merely to determine which effective address to use for the cache access. For two other circumstances, if there are two lines in the L1 cache that map to the same real address, one of the lines should be invalidated in the L1. One of these two circumstances is snoop invalidating by the L2 cache, wherein the L2 tells the L1 cache a line to invalidate. In this instance, the L2 addresses the line by its real address but the L1 is addressed by effective addresses. The second of the two circumstances is for a reload, i.e., to replace a line in the L1 whether the line is valid or not. For this circumstance a determination must be made whether there is another line having a different effective address but the same real address in the L1. Since the RA tag is accessed for a lookup for all three circumstances, but in one of them there is no need to invalidate, i.e., clear, i.e., write to a line in the L1, the global enable signal is therefore selectively asserted depending on the circumstance. See reference, "Real Address Tag Array".

Responsive to the global enable and column select signals being asserted and clock C1 being asserted, the output voltage on the output 419 of the logic circuitry 410 is pulled down through FET's N3, N13B and N4, which also pulls up the output voltage on node 424 of latch circuitry 420 through inverter I141. This node 424 is held up through FET's P1, N88 and N4 until clock C1 is next deasserted.

Asserting of the write column signal is triggered responsive to the compare match signal 128 being asserted concurrent with the latch circuitry 420 output signal being asserted on node 434. The latch 420 output signal is asserted responsive to the column select signal being asserted, along with the global enable signal and clock signal C1, and is held until the next time C1 is deasserted.

It should be understood from the foregoing, that it is a particular advantage of the invention that since the write wordline signal is asserted in the next phase immediately subsequent to the certain phase during which the line was selected, and the write operation is responsive to the write wordline being asserted the write operation advantageously occurs during that next phase.

The description of the present embodiment has been presented for purposes of illustration, but is not intended to be exhaustive or to limit the invention to the form disclosed. Many modifications and variations will be apparent to those of ordinary skill in the art. For example, it should be understood that while the embodiment described involves clearing lines in an RA tag array, it would be within the spirit and scope of the invention to encompass an embodiment wherein the writing to a line involves more than clearing it, and the function of the memory array does not have to be limited to an RA tag array.

In FIGS. 5 and 6, clock signal C1 is shown 180 degrees lagging clock signal C2, however, this does not imply the invention is limited to this arrangement. Clock signal C1 could lag clock signal C2 by some other amount. It is merely significant, for example in the embodiment of the write wordline generator of FIG. 3, that the wordline signal and C1 are concurrently asserted for at least a brief interval, and that the write wordline signal is then held up until C1 is deasserted, as described herein. Similar issues apply for the embodiment of the column generator of FIG. 4. Moreover, it is not implied that C1 must be derived directly from C2. There may be numerous clock signals other than just C1 and C2. Alternatively, it should be understood that the clock signal C2 itself could be used for the circuits of generators 300 and 400 with minor, well-known alterations to the circuits. Therefore, it should be understood that references to the "second clock signal" herein, which generally refer to clock signal C1, should be taken as merely referring to a signal of the same frequency, but lagging clock signal C2.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

What is claimed is:

1. A method for selectively writing to a line in a memory array, comprising the steps of:

a) selecting a line in the memory array responsive to a first clock signal being asserted;

b) comparing contents of the selected line in the memory array to a value; and c) writing to the selected line after the clock signal is asserted and before the clock signal is reasserted and responsive to the comparing.

2. The method of claim 1, wherein step a) comprises the steps of:

asserting an address signal to an address decoder during the first phase of the clock signal;

asserting a wordline signal for the line in the memory array responsive to decoding the address.

3. The method of claim 2, wherein step c) comprises the step of:

asserting a write wordline signal for the line, and wherein the writing is responsive to the write wordline signal.

4. The method of claim 3, wherein the step of asserting the write wordline signal for the line comprises the step of:

deasserting the wordline signal responsive to the clock signal being deasserted, wherein the asserting of the write wordline signal is triggered responsive to the wordline transitioning from being asserted to being not asserted, and the write wordline signal is held asserted until a second clock signal, which lags the first clock signal, is deasserted.

5. The method of claim 4, wherein step c) comprises the steps of:

asserting a compare match signal responsive to the contents matching the value, and wherein the writing to the line is responsive to the compare match and write wordline signals.

6. The method of claim 5, the memory array being folded, wherein the array has first and second columns of bit lines, and the method comprise the step of:

asserting a column select signal responsive to decoding the address.

7. The method of claim 6, comprising the step of asserting a write column signal for the line, wherein the writing to the line is responsive to the write column signal.

8. The method of claim 7, wherein asserting of the write column signal is triggered responsive to the column select signal being asserted concurrent with the second clock signal being asserted, and is held until the second clock signal is deasserted.

9. The method of claim 8, wherein the asserting of the write column signal is triggered responsive to the compare match signal.

10. An apparatus comprising:

a memory array having lines of memory cells, the lines including respective valid bits and being coupled to respective wordlines for selecting by a wordline signal asserted responsive to a first clock signal being asserted;

write wordline generators coupled to respective ones of the wordlines, such a write wordline generator being operable to assert a write wordline signal responsive to a second clock signal being asserted but after the first clock signal is deasserted, which is immediately subsequent to the certain phase during which the line was selected; and a comparator having i) first inputs coupled to bit lines of the memory cells, ii) second inputs for reading a data value and iii) a compare match output, the comparator being operable to read contents of memory cells of a selected line and output a compare match signal responsive to the contents matching the data value, wherein the selected line is written to responsive to the compare match and write wordline signals.

11. The apparatus of claim 10 comprising an address decoder coupled to the wordlines and to address lines, wherein the address decoder is operable to assert a signal on one of the wordlines responsive to an address being asserted on the address lines.

12. The apparatus of claim 11, wherein the write wordline generator comprises:

first combinational logic circuitry having first and second input nodes coupled respectively to a version of the clock signal and one of the wordlines, wherein the first combinational logic circuitry has an output node and is operable to assert a voltage on the output node responsive to the second clock signal being asserted concurrent with the wordline signal being asserted for the wordline.

13. The apparatus of claim 12, wherein the write wordline generator comprises:

first latch circuitry having an input node coupled to the first combinational logic circuitry output node, wherein the latch circuitry has an output node and is operable is operable to trigger asserting a voltage on the latch circuitry output node responsive to the first combinational logic circuitry output being asserted, and to hold the second voltage until the second clock signal is deasserted.

14. The apparatus of claim 13, wherein the write wordline generator comprises:

first final stage circuitry having first and second input nodes coupled respectively to the wordline and the latch circuitry output node, wherein the final stage circuitry has an output node and is operable to assert a voltage on the final stage output node responsive to the wordline signal and the first latch circuitry output being asserted.

15. The apparatus of claim 14, the memory array being folded, wherein the array has first and second columns of bit lines, and the address decoder has a column select output and is operable to assert a column select signal on the column select output responsive to the address asserted on the address lines.

16. The apparatus of claim 15 comprising:

write column generators for the respective columns, the write column generators being coupled to the compare match output and the column select output, wherein such a write column generator is operable to assert a write column signal responsive to the compare match signal and the column select signal in order to write to the line selected by one of the wordlines and the column selected by the column select signal.

17. The apparatus of claim 16, wherein such a write column generator comprises:

second combinational logic circuitry having first and second input nodes coupled respectively to the version of the clock signal and the column select output, wherein the second combinational logic circuitry has an output node and is operable to assert a voltage on the second combinational logic circuitry output node responsive to the second clock signal being asserted concurrent with the column select signal being asserted.

18. The apparatus of claim 17, wherein such a write column generator comprises:

second latch circuitry having an input node coupled to the second combinational logic circuitry output node, wherein the second latch circuitry has an output node and is operable to trigger asserting a voltage on the second latch circuitry output node responsive to the second combinational circuitry output being asserted, and to hold the second voltage until the second clock signal is deasserted.

19. The apparatus of claim 18, wherein the write column generator comprises:

second final stage circuitry having first and second input nodes coupled to the compare match output and to the second latch circuitry output node, wherein the second final stage circuitry has an output node and is operable to assert a voltage on the second final stage output node responsive to the compare match signal and the second latch circuitry output being asserted.

* * * * *